(12) United States Patent
Lee et al.

(10) Patent No.: US 7,186,571 B2
(45) Date of Patent: Mar. 6, 2007

(54) METHOD OF FABRICATING A COMPOSITIONALLY MODULATED ELECTRODE IN A MAGNETIC TUNNEL JUNCTION DEVICE

(75) Inventors: Heon Lee, Pohang-Si (KR); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 149 days.

(21) Appl. No.: 10/769,107

(22) Filed: Jan. 30, 2004

(65) Prior Publication Data

US 2005/0170533 A1    Aug. 4, 2005

(51) Int. Cl.
  *H01L 21/00* (2006.01)
(52) U.S. Cl. .......................... 438/3; 438/128; 438/130; 438/658; 438/660
(58) Field of Classification Search ...................... None
  See application file for complete search history.

(56) References Cited

U.S. PATENT DOCUMENTS 6,657,826 B2 * 12/2003 Shimazawa et al. ........ 360/322
6,818,458 B1 * 11/2004 Gill .............................. 438/3
6,887,717 B2 * 5/2005 Hiramoto et al. .............. 438/3
6,993,827 B2 * 2/2006 Horng et al. ............ 29/603.14
7,001,777 B1 * 2/2006 Adelerhof et al. ............. 438/3

\* cited by examiner

Primary Examiner—Zandra V. Smith
Assistant Examiner—Khanh Duong

(57) ABSTRACT

A magnetic tunnel junction device with a compositionally modulated electrode and a method of fabricating a magnetic tunnel junction device with a compositionally modulated electrode are disclosed. An electrode in electrical communication with a data layer of the magnetic tunnel junction device includes a high resistivity region that has a higher resistivity than the electrode. As a result, a current flowing through the electrode generates joule heating in the high resistivity region and that joule heating increases a temperature of the data layer and reduces a coercivity of the data layer. Consequently, a magnitude of a switching field required to rotate an alterable orientation of magnetization of the data layer is reduced. The high resistivity region can be fabricated using a plasma oxidation, a plasma nitridation, a plasma carburization, or an alloying process.

19 Claims, 11 Drawing Sheets

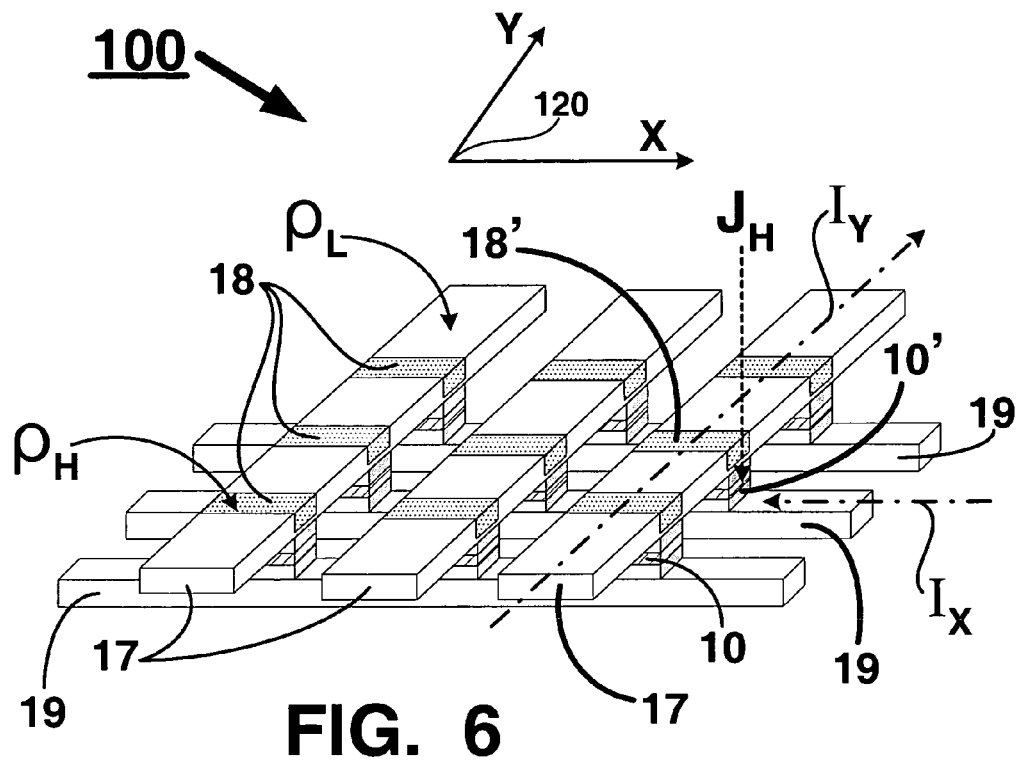
FIG. 6
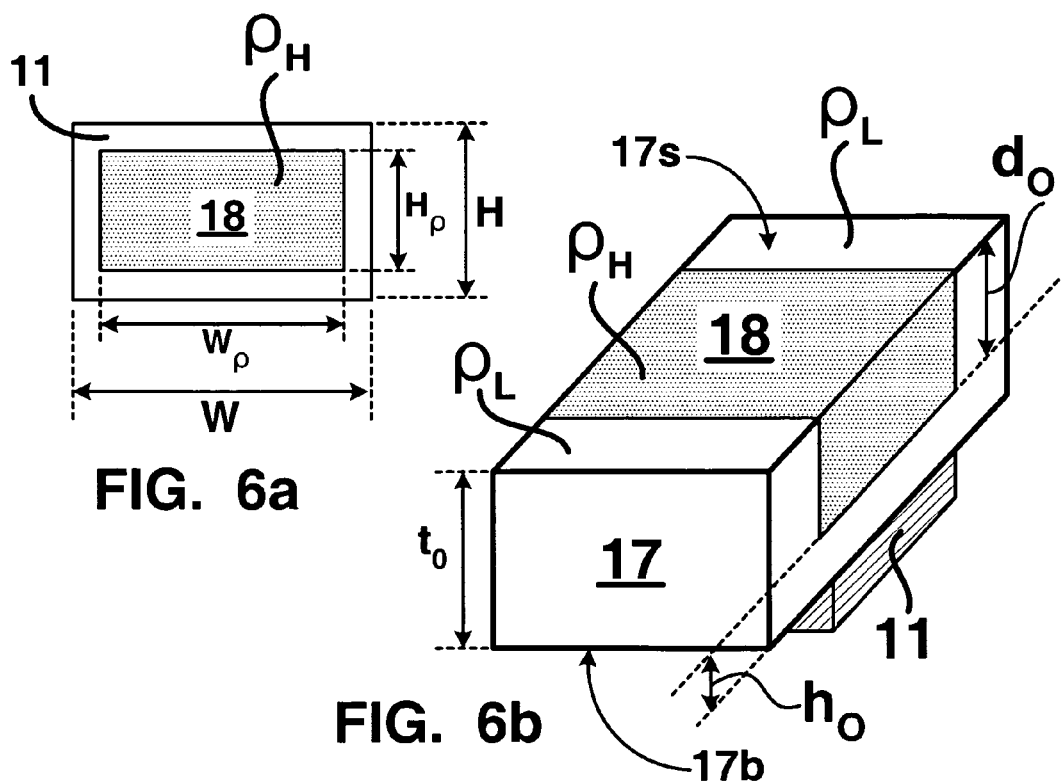
FIG. 6a
FIG. 6b

METHOD OF FABRICATING A COMPOSITIONALLY MODULATED ELECTRODE IN A MAGNETIC TUNNEL JUNCTION DEVICE

FIELD OF THE INVENTION

The present invention relates generally to a magnetic tunnel junction device including a compositionally modulated electrode and a method of fabricating the same. More specifically, the present invention relates to a magnetic tunnel junction device including a compositionally modulated electrode in which the electrode includes a high resistivity region operative to generate joule heating in response to a current flowing in the electrode. The high resistivity region can be fabricated using a process including a plasma oxidation, a plasma nitridation, a plasma carburization, or an alloying process.

BACKGROUND OF THE ART

Magnetic Random Access Memory (MRAM) is an emerging technology that can provide an alternative to traditional data storage technologies. MRAM has desirable properties including fast access times like DRAM and non-volatile data retention like hard disc drives. MRAM stores a bit of data (i.e. information) as an alterable orientation of magnetization in a patterned thin film magnetic element that is referred to as a data layer, a sense layer, a storage layer, or a data film. The data layer is designed so that it has two stable and distinct magnetic states that define a binary one ("1") and a binary zero ("0"). Although the bit of data is stored in the data layer, many layers of carefully controlled magnetic and dielectric thin film materials are required to form a complete magnetic memory element. One prominent form of magnetic memory element is a spin tunneling device. The physics of spin tunneling is complex and good literature exists on the subject of spin tunneling.

In FIG. 1a, a prior magnetic tunnel junction device 201 includes a data layer 202 and a reference layer 204 that are separated by a thin tunnel barrier layer 206. Typically the tunnel barrier layer 206 has a thickness that is less than about 2.0 nm, for example. In a tunneling magnetoresistance (TMR) structure the tunnel barrier layer 206 is an electrically non-conductive dielectric material such as aluminum oxide ($Al_2O_3$), for example. Whereas, in a giant magnetoresistance (GMR) structure the tunnel barrier layer 206 is a thin layer of an electrically conductive material such as copper (Cu), for example.

The reference layer 204 has a pinned orientation of magnetization 208, that is, the pinned orientation of magnetization 208 is fixed in a predetermined direction and does not rotate in response to an external magnetic field. In contrast the data layer 202 has an alterable orientation of magnetization 203 that can rotate between two orientations in response to an external magnetic field.

In FIG. 1b, when the pinned orientation of magnetization 208 and the alterable orientation of magnetization 203 point in the same direction (i.e. they are parallel to each other) the data layer 202 stores a binary one ("1"). On the other hand, when the pinned orientation of magnetization 208 and the alterable orientation of magnetization 203 point in opposite directions (i.e. they are anti-parallel to each other) the data layer 202 stores a binary zero ("0").

In FIG. 1c, the prior magnetic tunnel junction device 201 is typically positioned at an intersection of two orthogonal conductors 205 and 207. The conductors (205, 207) are also referred to as electrodes, write lines, row conductors, column conductors, word lines, and bit lines. For instance, the conductor 205 can be a word line and the conductor 207 can be a bit line. A bit of data is written to the prior magnetic tunnel junction device 201 by generating two magnetic fields $h_X$ and $h_Y$ that are in turn generated by currents $i_Y$ and $i_X$ flowing in the conductors 207 and 205 respectively. For purposes of illustration, the current $i_X$ is depicted as flowing in a direction parallel to a x-axis X and the current $i_Y$ is depicted as flowing in a direction parallel to a y-axis Y.

The magnetic fields $h_X$ and $h_Y$ cooperatively interact with the data layer 202 to rotate the alterable orientation of magnetization 203 from a current orientation to a new orientation. Therefore, if the current orientation is parallel (i.e. positive x-direction on the x-axis) with the pinned orientation of magnetization 208 such that a binary "1" is stored in the data layer 202, then the magnetic fields $h_X$ and $h_Y$ will rotate the alterable orientation of magnetization 203 to an anti-parallel orientation (i.e. negative x-direction on the x-axis) such that a binary "0" is stored in the data layer 202.

In FIG. 2, the prior magnetic tunnel junction device 201 can be positioned in an array 301 of similar prior magnetic tunnel junction devices 201 that are also positioned at an intersection of a plurality of conductors (207, 205) that are arranged in rows and columns. The configuration depicted is typical of prior MRAM devices. For purposes of illustration, in FIG. 2, the conductors 207 are bit lines and the conductors 205 are word lines. The conductors (205, 207) need not be in direct contact with the prior magnetic tunnel junction devices 201. Typically, one or more layers of material separate the conductors (205, 207) from the data layer 202 and the reference layer 204.

A bit of data is written to a selected one of the prior magnetic tunnel junction devices 201 that is positioned at an intersection of a word and bit line by passing the aforementioned currents $i_Y$ and $i_X$ through the word and bit lines. During a normal write operation the selected magnetic tunnel junction device 201 will be written to only if the combined magnetic fields $h_X$ and $h_Y$ are of a sufficient magnitude to switch (i.e. rotate) the alterable orientation of magnetization 203 of the prior magnetic tunnel junction device 201.

One disadvantage of the prior magnetic tunnel junction device 201 is that a coercivity $H_C$ of a material of the data layer 202 is relatively high at a typical operating temperature of the prior magnetic tunnel junction device 201. In FIG. 3, a curve 300 depicts a magnitude of a switching field (i.e. $h_X$ and $h_Y$) required to rotate the alterable orientation of magnetization 203 as a function of a temperature T mp (on an x-axis) of the data layer 202 and a coercivity $H_C$ (on a y-axis) of the data layer 202. The lower the temperature T mp the higher the coercivity $H_C$. Accordingly, at a typical operating temperature of $T_1$, the data layer 202 has a coercivity $H_C$ at $T_1$ that results in a switching field $S_H$ that is relatively high on the curve 300.

Disadvantages to the high switching field $S_H$ include high currents for $i_Y$ and $i_X$ in order to generate the required magnitude of the switching field $S_H$ and those high currents require large driver circuits to supply the current. Large driver circuits increase an areal density of the MRAM and generate waste heat. Moreover, a major disadvantage to the high switching field $S_H$ is that a magnitude of the fields $h_X$ and $h_Y$ that comprise the switching field $S_H$ are such that non-selected magnetic tunnel junction devices 201 in the array 301 of FIG. 2 can have their respective alterable orientation of magnetization 203 switched by the fields $h_X$ and $h_Y$ during a write operation to a selected magnetic tunnel junction device 201. As a result, data stored in the array 301 can be corrupted. The effect of the fields $h_X$ and $h_Y$ on non-selected magnetic tunnel junction devices 201 is referred to as a half-select margin. Ideally, only the data in the selected magnetic tunnel junction device 201 is written to during a write operation.

Consequently, there exists a need for a magnetic tunnel junction device in which a temperature of a data layer is increased during a write operation to the magnetic tunnel junction device so that a coercivity of the data layer is reduced and a magnitude of a switching field necessary to write data to the data layer is also reduced.

SUMMARY OF THE INVENTION

The magnetic tunnel junction device of the present invention solves the aforementioned disadvantages of the prior magnetic tunnel junction devices. An electrode in electrical communication with a data layer of the magnetic tunnel junction device includes a high resistivity region that has a higher resistivity than the electrode. Consequently, joule heating occurs in the high resistivity region when a current flows through the electrode. The heating raises a temperature of the data layer thereby reducing a coercivity of the data layer. The reduced coercivity reduces a magnitude of a switching filed necessary to rotate an alterable orientation of magnetization of the data layer during a write operation to the data layer.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 6 is a profile view of an array of magnetic tunnel junction devices with compositionally modulated electrodes.

FIG. 6a is a top plan view depicting a high resistivity region of an electrode relative to a data layer of a magnetic tunnel junction device.

FIG. 6b is a profile view depicting a high resistivity region of a compositionally modulated electrode.

DETAILED DESCRIPTION

Figure 1A:
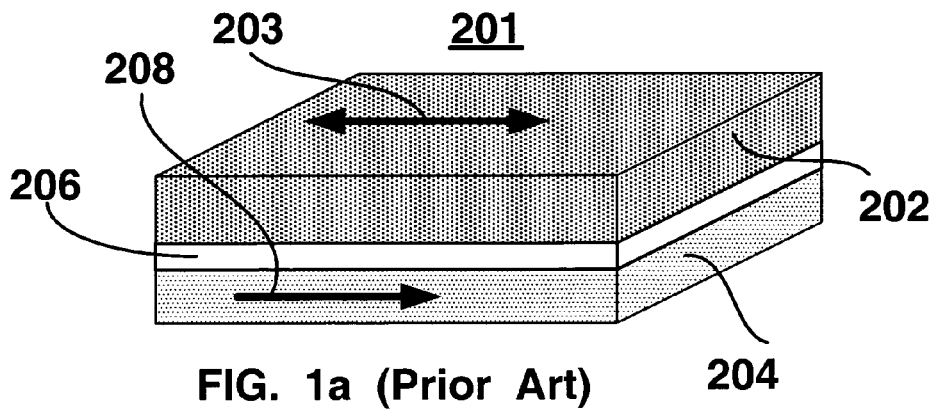
FIG. 1a is a profile view depicting a prior magnetic tunnel junction device.
Figure 1B:
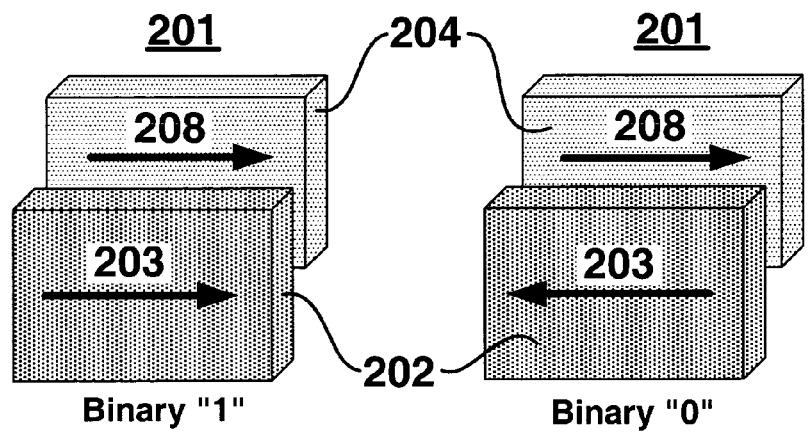
FIG. 1b is a profile view depicting data storage in a prior magnetic tunnel junction device.
Figure 1C:
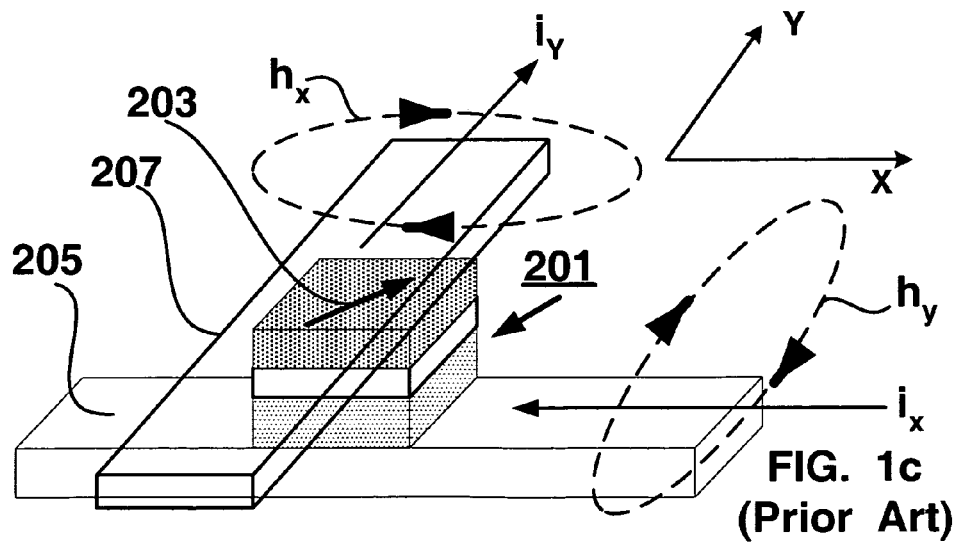
FIG. 1c is a profile view depicting a pair of write conductors that cross the prior magnetic tunnel junction device.
Figure 2:
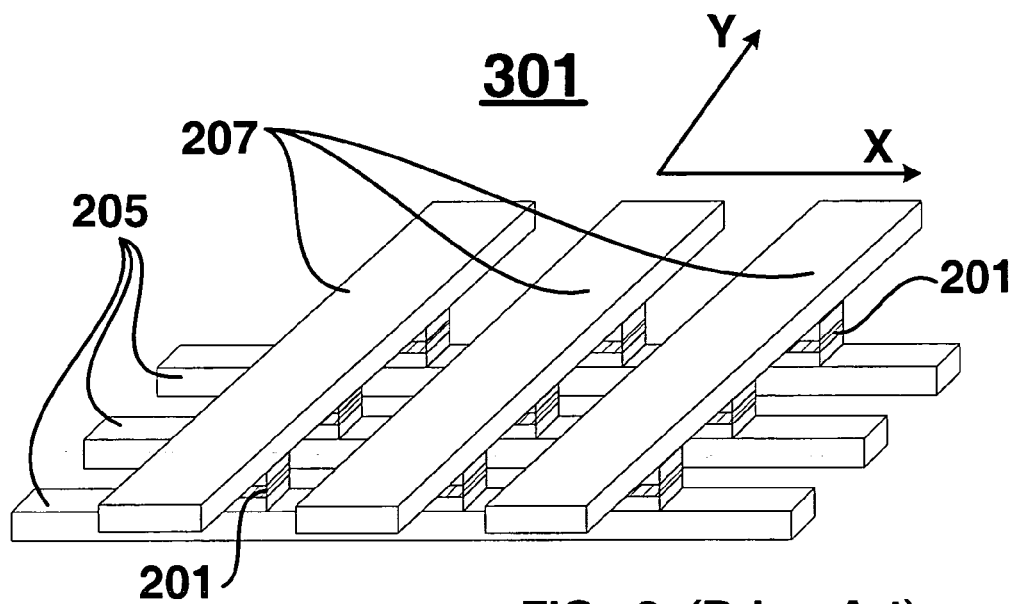
FIG. 2 is a profile view of an array of prior magnetic tunnel junction devices positioned between a plurality of row and column conductors.
Figure 3:
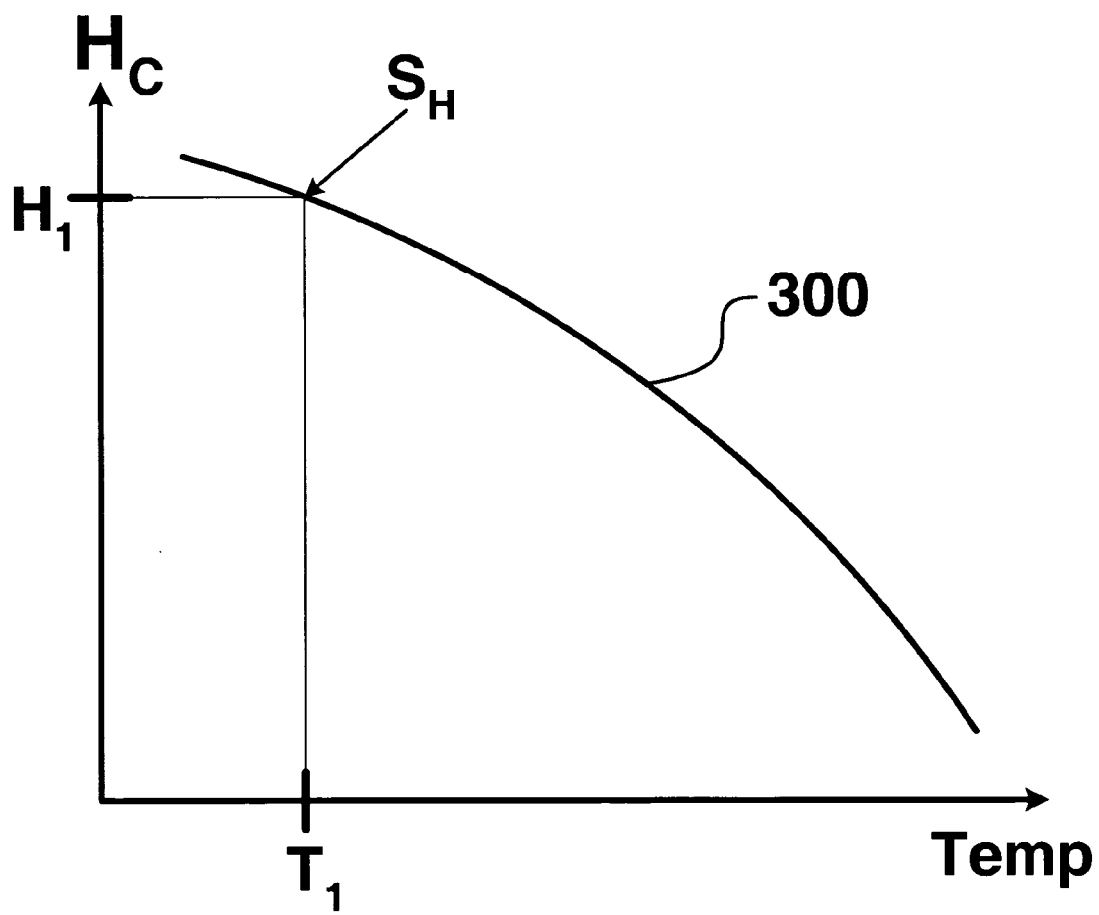
FIG. 3 is a graph depicting a high coercivity and a high switching field for the prior magnetic tunnel junction device.

In the following detailed description and in the several figures of the drawings, like elements are identified with like reference numerals.

As shown in the drawings for purpose of illustration, the present invention is embodied in a magnetic tunnel junction device with a compositionally modulated electrode, and a method of fabricating a magnetic tunnel junction device with a compositionally modulated electrode.

A magnetic tunnel junction device with a compositionally modulated electrode includes a reference layer that includes a pinned orientation of magnetization, a first electrode in electrical communication with the reference layer, a data layer including an alterable orientation of magnetization, a tunnel barrier layer positioned intermediate between the data layer and the reference layer, and an electrode in electrical communication with the data layer and including a first resistivity. The electrode includes a high resistivity region that includes a second resistivity. The second resistivity is higher than the first resistivity.

The high resistivity region is disposed in the electrode and is positioned substantially over the data layer. Joule heating is generated in the high resistivity region in response to a write current flowing in the electrode during a write operation to the data layer (i.e. to change the bit of data from a "0" to a "1" or vice-versa). The joule heat is thermally conducted into the data layer where it heats up the data layer and reduces a coercivity of the data layer. As a result, a magnitude of a switching field operative to rotate the alterable orientation of magnetization is reduced. The coercivity of the data layer is a function of temperature and as a temperature of the data layer increases the coercivity of the data layer decreases.

The reduction in coercivity is particularly important during a write operation to the data layer where write currents flowing in the electrode and the first electrode generate magnetic fields that cooperatively interact to create a switching field that causes the alterable orientation of magnetization to rotate (i.e. flip) from a first stable orientation to a second stable orientation so that a state of the data stored in the data layer is changed from a logic "0" to a logic "1", or vice-versa. One advantage of the magnetic tunnel junction device with a compositionally modulated electrode is that the high resistivity region generates the joule heat that heats up the data layer during the write operation and reduces the coercivity of the data layer during the write operation. The reduction in coercivity also reduces a magnitude of the switching field necessary to rotate the alterable orientation of magnetization.

A method of fabricating a compositionally modulated electrode in a magnetic tunnel junction device includes depositing 62 a mask layer on a surface of a previously fabricated electrode of the magnetic tunnel junction device, patterning 64 a plasma mask in the mask layer, forming 66 the plasma mask in the mask layer, and forming 68 a high resistivity region that extends inward of the surface of the electrode using a plasma oxidation process, a plasma nitridation process, or a plasma carburization process, and removing 70 the plasma mask.

Alternatively, a method of fabricating a compositionally modulated electrode in a magnetic tunnel junction device includes depositing 82 an alloy layer on a surface of a previously fabricated electrode of the magnetic tunnel junction device, depositing 84 a mask layer on the alloy layer, patterning 86 the mask layer to form an etch mask on the alloy layer, etching 88 the alloy layer to form an alloy patch on the surface of the electrode, removing 90 the etch mask, and alloying 92 the alloy patch with the electrode by applying heat to form a high resistivity region that extends inward of the surface of the electrode.

Figure 5:
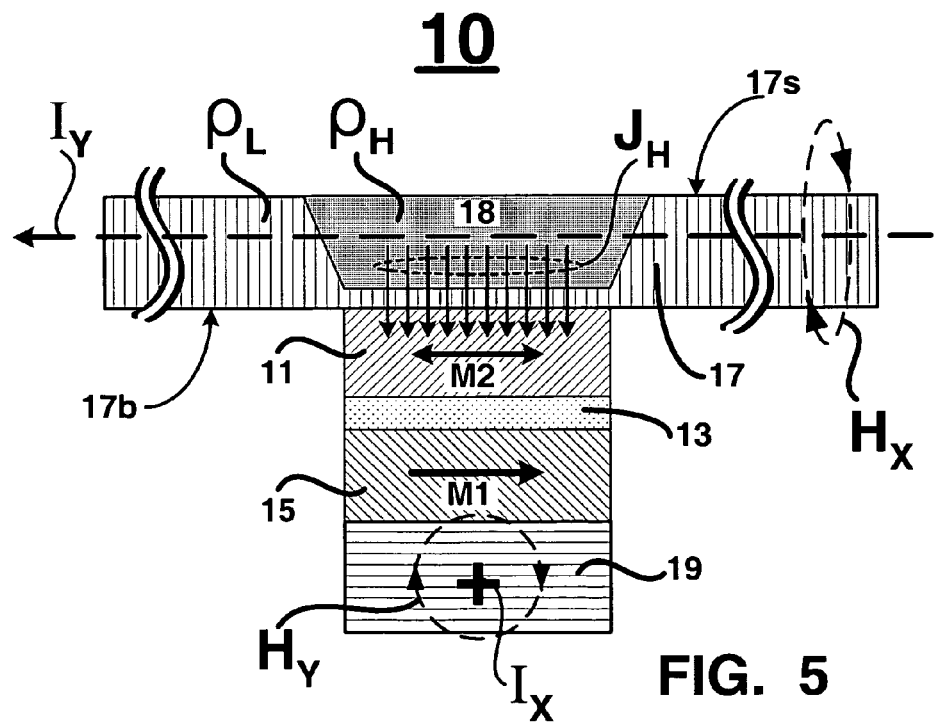
FIG. 5 is a cross-sectional view depicting a magnetic tunnel junction device with a compositionally modulated electrode.

In FIG. 5, a magnetic tunnel junction device 10 includes a data layer 11 including an alterable orientation of magnetization M2. In the MRAM art, the data layer 11 is also referred to as a sense layer, a storage layer, and a free layer. The data layer 11 stores a bit of information (i.e. a "1" or a "0") as one of two stable orientations of the alterable orientation of magnetization M2. A reference layer 15 including a pinned orientation of magnetization M1 and a first electrode 19 in electrical communication with the reference layer 15. In the MRAM art, the reference layer 15 is also referred to as a pinned layer or a pinning layer. A tunnel barrier layer 13 is positioned intermediate between the data layer 11 and the reference layer 15. Depending on a topology of the magnetic tunnel junction device 10, the tunnel barrier layer 13 may or may not be in direct contact with the data layer 11 and/or the reference layer 15. For purposes of illustration only, the tunnel barrier layer is depicted as being in direct contact with the data layer 11 and the reference layer 15. An electrode 17 is in electrical communication with the data layer 11 and the electrode 17 includes a first resistivity denoted as $\rho_L$. The electrode 17 also includes a high resistivity region 18 that includes a second resistivity $\rho_H$ that is higher than the first resistivity $\rho_L$ (i.e. $\rho_H > \rho_L$). The high resistivity region 18 is disposed in the electrode 17 and is positioned substantially over the data layer 11. The high resistivity region 18 is operative to generate a joule heat $J_H$ in response to a write current $I_Y$ flowing in the electrode 17. The joule heat $J_H$ is thermally conducted into the data layer 11 and heats the data layer 11 so that a coercivity $H_C$ of the data layer 11 is reduced.

Figure 4:
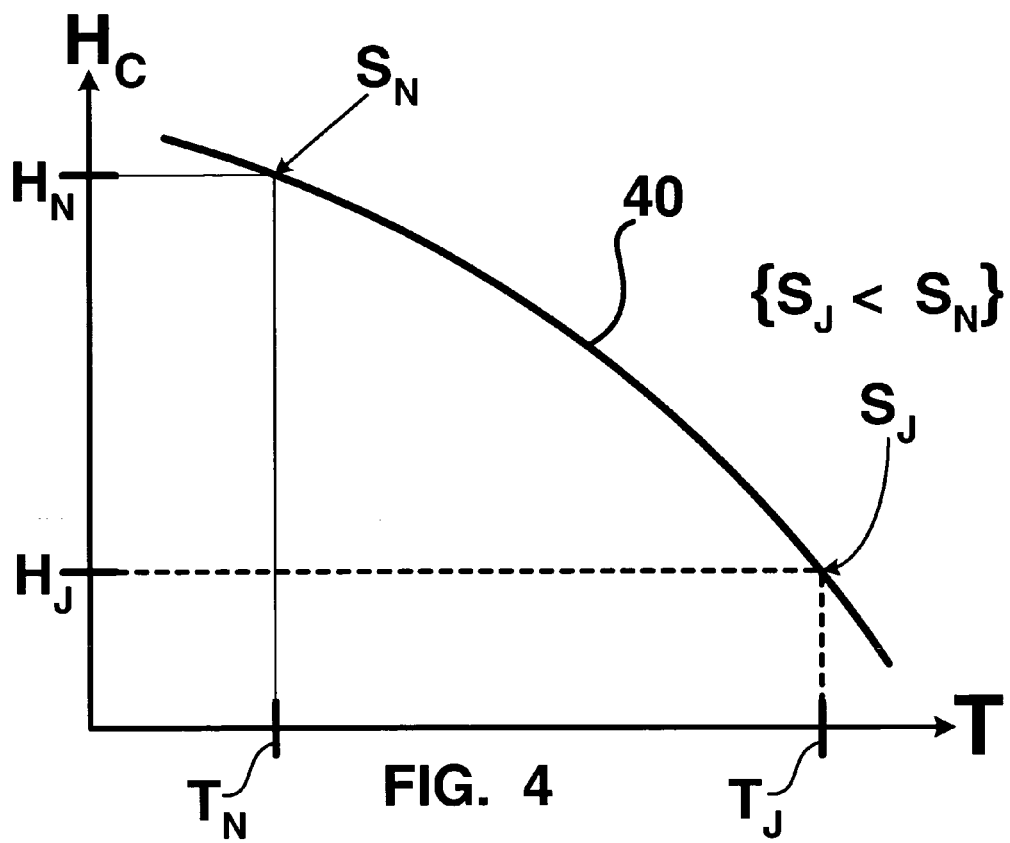
FIG. 4 is a graph depicting a low coercivity at a high temperature for a magnetic tunnel junction device with a compositionally modulated electrode.

In FIG. 4, a curve 40 depicts a magnitude of a switching field necessary to rotate the alterable orientation of magnetization M2 of the data layer 11 as a function of a coercivity $H_C$ (increasing along a y-axis) and a temperature T (increasing along a x-axis) of the data layer 11. At a nominal temperature $T_N$, the data layer 11 has a nominal coercivity $H_N$ and a nominal magnitude of a switching field $S_N$ on the curve 40.

For instance, the nominal temperature of $T_N$ can be a room temperature (e.g. about 25° C.) or the nominal temperature of $T_N$ can be an operating temperature of the magnetic tunnel junction device 10 or an MRAM devices that includes the magnetic tunnel junction device 10. Accordingly, at the nominal temperature $T_N$ the coercivity $H_C$ of the data layer 11 is the nominal coercivity $H_N$, which is relatively high on the coercivity $H_C$ axis and the magnitude of the switching field is the nominal switching field $S_N$, which is also relatively high on the switching field curve 40 as illustrated by the solid lines intersecting the curve 40 at $S_N$.

Because the coercivity $H_C$ of the data layer 11 decreases as temperature T increases, as illustrated by the curve 40, the heating up of the data layer 11 by the joule heat $J_H$ operates to increase the temperature T of the data layer 11 to a higher temperature $T_J$ that is higher than the nominal temperature $T_N$. Consequently, at the higher temperature $T_J$, the coercivity $H_C$ of the data layer 11 is reduced to a lower coercivity $H_J$ with a resulting reduction in a magnitude of the switching field as depicted by the intersection of the heavy dashed lines with the switching field curve 40 at the lower switching field $S_J$. Accordingly, the switching field $S_J$ at the higher temperature $T_J$ is less than the nominal switching field $S_N$ at the lower temperature $T_N$ (that is at $T_N$: $S_J < S_N$).

The high resistivity region 18 need not be perfectly centered or symmetrically centered over the data layer 11; however, it is desirable for the high resistivity region 18 to be positioned in relation to the data layer 11 so that the joule heat $J_H$ is efficiently transferred to the data layer 11, heats up the data layer 11, and the coercivity $H_C$ of the data layer 11 is reduced as described above.

The joule heat $J_H$ is generated because the second resistivity $\rho_H$ of the high resistivity region 18 increase a resistance to the flow of electrons in the electrode 17 and the write current $I_Y$ flowing through the electrode 17 cause waste heat to be generated in the high resistivity region 18 due to the second resistivity $\rho_H$ being higher than the first resistivity $\rho_L$ of the electrode 17 (i.e. $\rho H > \rho L$). Accordingly, the joule heat $J_H$ is proportional to a product of a resistance R of the electrode 17 at the high resistivity region 18 and the write current $I_Y$ such that:

$$J_H \propto (I_Y)^{2*R}$$

In FIG. 5, the switching field $S_J$ is generated by magnetic fields created by the write currents ($I_Y$, $I_X$) flowing in the electrode 17 and the first electrode 19. The write current $I_Y$ generates a magnetic field $H_X$ and the write current $I_X$ (flowing in the first electrode 19) generates a magnetic field $H_Y$. The magnetic fields ($H_Y$, $H_X$) contribute to a portion of the switching field $S_J$ and cooperatively interact with the alterable orientation of magnetization M2 and cause the alterable orientation of magnetization M2 to rotate. In FIG. 5, the write current $I_X$ flows through the first electrode 19 and is depicted as flowing into the drawing sheet (i.e. into the page).

Although not depicted in FIG. 5, the magnetic tunnel junction device 10 can include a second electrode 21 (see FIGS. 9e and 10f) that is positioned adjacent to the first electrode 19 and is electrically isolated from the first electrode 19. For example, the second electrode 21 can be separated from the first electrode 19 by a dielectric material such as silicon oxide ($SiO_2$). The second electrode 21 is operative to generate a portion $H_Y$ of the switching field $S_J$ in response to the write current $I_X$ flowing in the second electrode 21. When the second electrode 21 is used, the electrode 17 and the first electrode 19 can be used to sense the state of the alterable orientation of magnetization M2 during a read operation to the magnetic tunnel junction device 10 so the data stored in the data layer 11 can be read. The electrode 17 and the second electrode 21 are used to write data to the data layer 11 in response to the aforementioned write currents ($I_Y$, $I_X$).

As will be described below in reference to a method for fabricating a compositionally modulated electrode in a magnetic tunnel junction device, the high resistivity region 18 can be made from a material including but not limited to an alloy of a material of the electrode 17 with a second material, a material that has been oxidized by a plasma oxidation process, a material that has been nitridized by a plasma nitridation process, and a material that has been carburized by a plasma carburization process.

For example, the second material for the high resistivity region 18 can be a metal or a metal alloy that is alloyed with the material of the electrode 17 and results in the high resistivity region 18 having the second resistivity $\rho_H$. As another example, the electrode 17 can be made from tungsten (W) and the second material can be a metal that is alloyed with the tungsten to form the high resistivity region 18.

In FIG. 6, a plurality of the magnetic tunnel junction devices 10 can be arranged in an array 100 in which each magnetic tunnel junction device 10 is positioned at an intersection of an electrode 17 and a first electrode 19. For example, the electrodes 17 can be arranged in columns and the first electrodes 19 can be arranged in rows, or vice-versa. The array 100 can be carried by a MRAM device used for data storage. A magnetic tunnel junction device 10 is selected for a write operation to its data layer 11 by passing the write currents ($I_Y$, $I_X$) through the respective electrodes (17, 19) that cross the selected magnetic tunnel junction device 10 as denoted by a selected magnetic tunnel junction device 10'. The high resistivity region 18' of the selected magnetic tunnel junction device 10' generates joule heat $J_H$ as described above. For purposes of illustration only, a X-Y axis 120 is shown to depict the current $I_X$ as flowing along a x-axis and the current $I_Y$ as flowing along a y-axis.

In FIG. 6a, the data layer 11 can have a width W and a height H that may not be identical to a width W$\rho$ and a height H$\rho$ of the high resistivity region 18. For example, the width W$\rho$ and the height H$\rho$ of the high resistivity region 18 can be smaller than the width W and the height H of the data layer 11. Although for purposes of illustration the high resistivity region 18 is depicted as being symmetrically positioned relative to the data layer 11, the actual position of the high resistivity region 18 need not be symmetrical relative to the data layer 11 and will depend on factors such as alignment errors that occur during the microelectronic fabrication processes that are used to fabricate the magnetic tunnel junction devices 10 and variations in the alloying and plasma processes as will be described below.

In FIG. 6b, the high resistivity region 18, the electrode 17, and the data layer 11 are depicted in greater detail. The high resistivity region 18 extends inward of a surface 17s of the electrode 17 by a predetermined depth $d_O$. Preferably, the high resistivity region 18 does not extend all the way through a thickness $t_O$ of the electrode 17 (i.e. to a bottom surface 17b) so that the high resistivity region 18 is offset from the bottom surface 17b by an offset distance $h_O$. The offset distance $h_O$ may be necessary to prevent the high resistivity region 18 from extending to the thin film layers in the magnetic tunnel junction stack 10 (e.g. the data layer 11) and damaging those layers due to the process and/or materials used to compositionally modulate the electrode 17 to form the high resistivity region 18.

Figure 7:
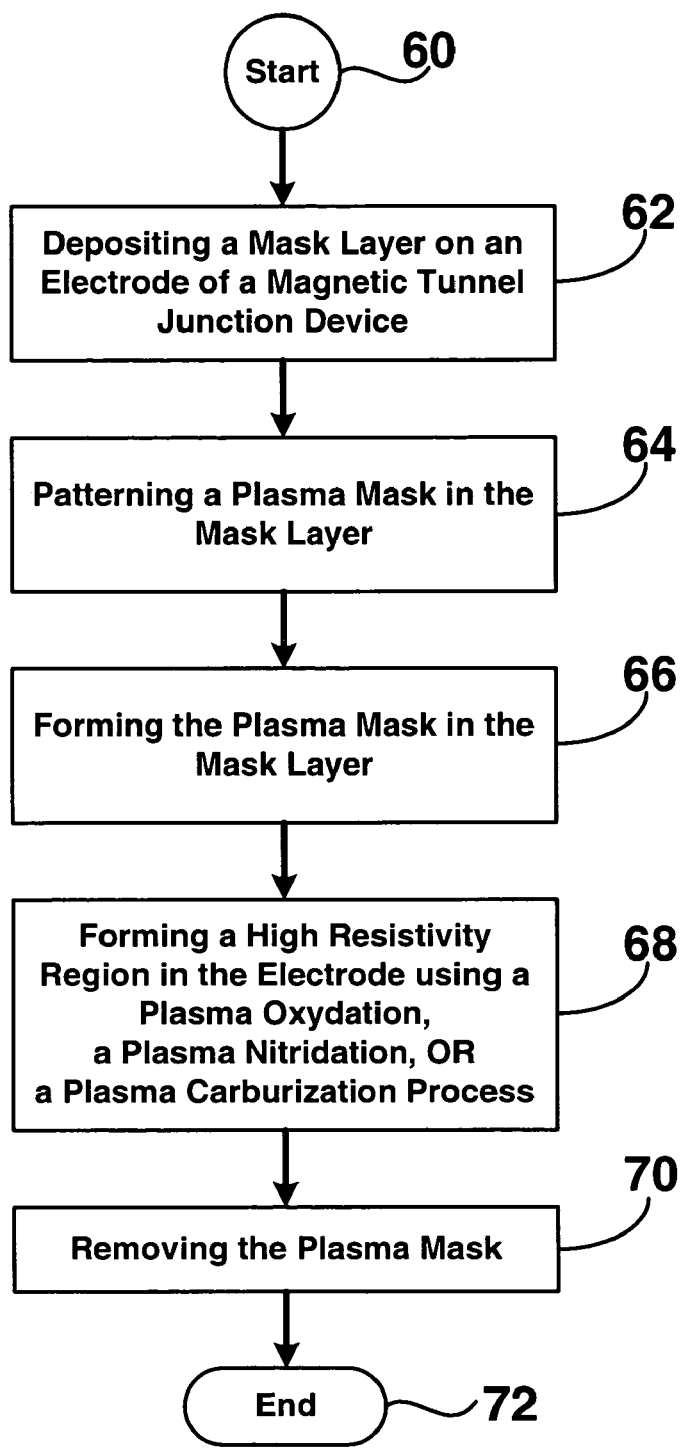
FIG. 7 is a flow diagram depicting a method of fabricating a magnetic tunnel junction device with a compositionally modulated electrode.
Figure 9A:
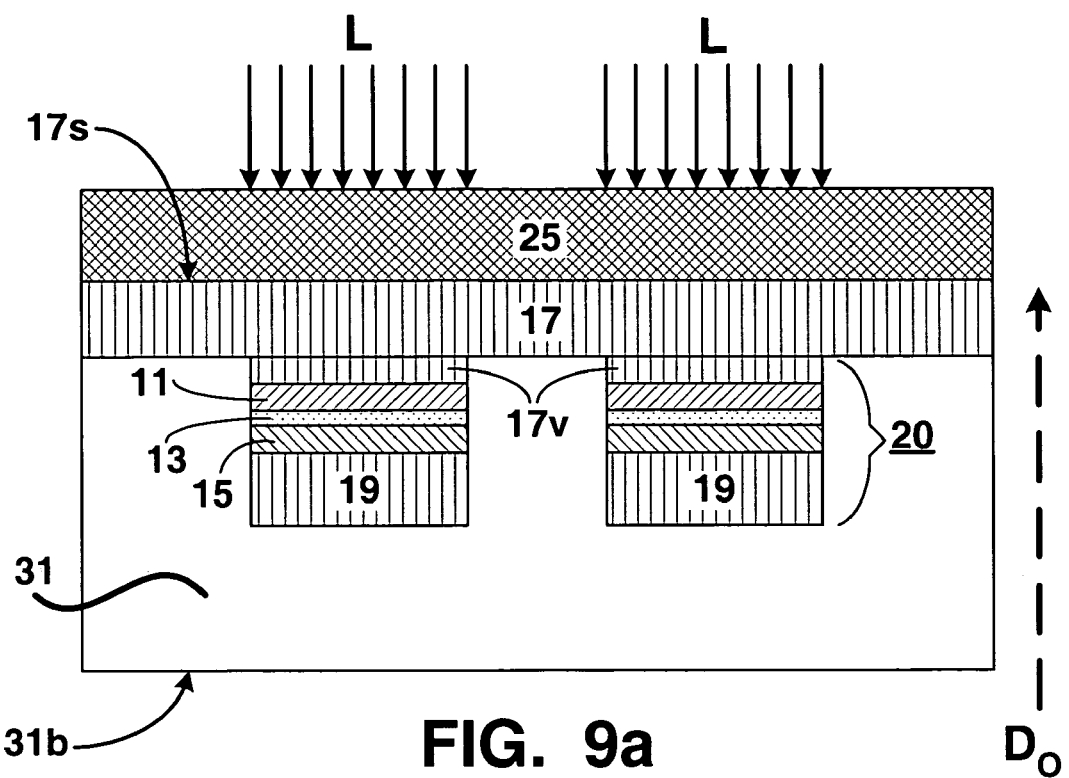
FIGS. 9a through 9e are cross-sectional views depicting fabrication of a magnetic tunnel junction device with a compositionally modulated electrode according to the method of FIG. 7.

In FIG. 9a and referring to a method of fabricating a compositionally modulated electrode in a magnetic tunnel junction device depicted in FIG. 7, at a stage 62, a mask layer 25 is deposited on a surface 17s of a previously fabricated electrode 17 of the magnetic tunnel junction device 10. The electrode 17 is in electrical communication with the data layer 11 either by direct contact (see FIG. 5) or by an intermediate structure such as a via 17v, a damascene contact, or the like.

Prior to a start of the method at a stage 60, the various thin film layers of material that comprise the magnetic tunnel junction device 10 (i.e. 11, 13, 15, 17, 17v, 19, 21 and 31) have been previously fabricated in a process order $D_O$. Moreover, the magnetic tunnel junction device 10 is not limited to the layers of material described herein. For instance, it is well known in the MRAM art to include other layers of material such as cap layers, pinning layers, seed layers, and antiferromagnetic layers, just to name a few. Unless otherwise noted, the layers of material that comprise the magnetic tunnel junction device 10 will be collectively denoted as a stack 20. In FIGS. 9a through 10f, the stack 20 is formed in a layer of dielectric material 31 and the layer of dielectric material 31 can be supported by a substrate (not shown) such as a semiconductor wafer or a silicon (Si) wafer. The dielectric material 31 can be a material including but not limited to silicon oxide ($SiO_2$), silicon nitride ($Si_3N_4$), a tetraethylorthosilicate (TEOS), and a doped tetraethylorthosilicate (TEOS).

Accordingly, the electrode 17 has already been deposited or otherwise formed in the process order $D_O$. As described above, the electrode 17 has a first resistivity $\rho_L$. The mask layer 25 can be a photoresist material or any other material that will serve as a suitable mask in a plasma oxidation, plasma nitridation, or plasma carburization process.

At a stage 64, a pattern for a plasma mask is patterned in the mask layer 25. Lithographic patterning process that are well understood in the microelectronics art can be used to pattern the mask layer 25. For example, the mask layer 25 can be made from a photoresist material and exposed to a light L through a photo mask (not shown) to transfer a pattern for the plasma mask to the mask layer 25.

Figure 9B:
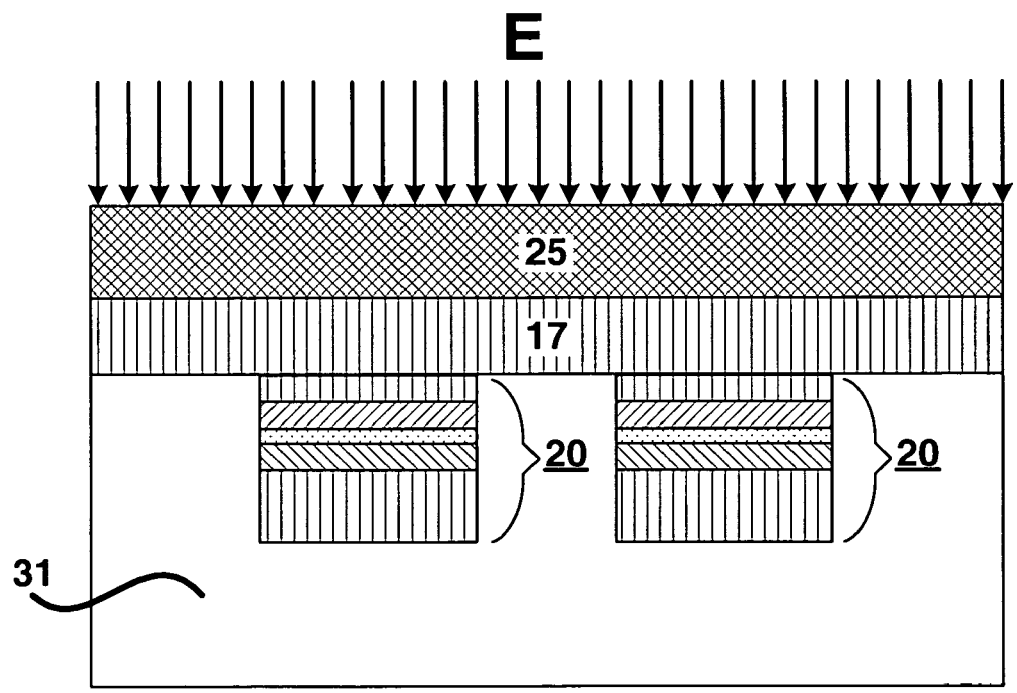

In FIG. 9b, at a stage 66, a plasma mask (not shown) is formed in the mask layer 25. For example, if a photoresist material is used, then the mask layer 25 can be developed in a solvent to remove only those portions of the mask layer 25 that were exposed to the light L. On the other hand, the mask layer 25 can be wet or dry etched E to form the plasma mask. Preferably, an anisotropic/directional etch process such as a reactive ion etch (RIE) is used to etch the mask layer 25 to form the plasma mask.

Figure 9C:
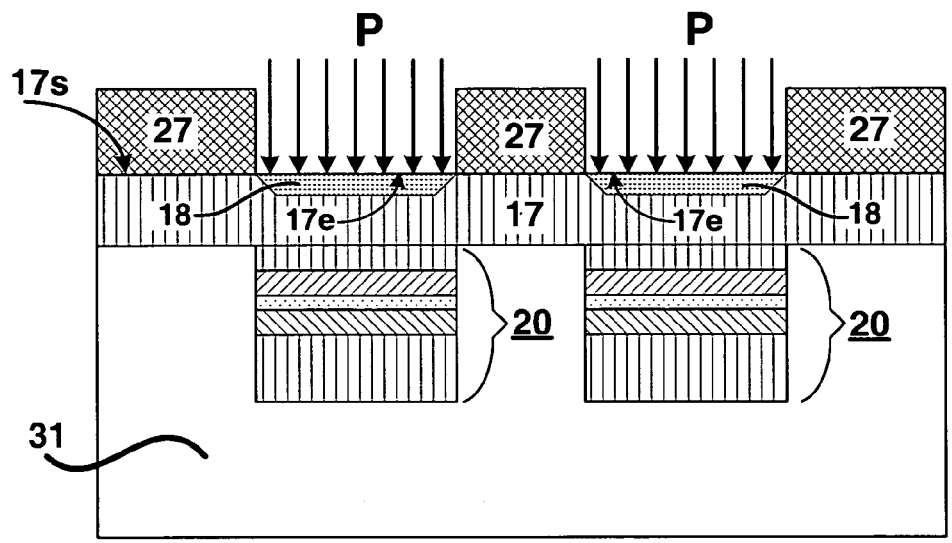

In FIG. 9c, a plasma mask 27 is formed on the electrode 17 and portions of the surface 17s of the electrode 17 are not covered by the plasma mask 27. Therefore, a portion 17 of the surface 17s is exposed by the plasma mask 27. At a stage 68, a high resistivity region 18 is formed in the electrode 17 by exposing the portion 17 to a plasma process P that modulates a composition of the electrode 17 in the high resistivity region 18. The plasma process P can be a process including but not limited to a plasma oxidation process, a plasma nitridation process, and a plasma carburization process. The plasma process P modulates the composition of the electrode 17 so that the high resistivity region 18 includes a second resistivity $\rho_H$ that is higher than the first resistivity $\rho_L$ of the electrode 17.

The plasma process P that forms the high resistivity region 18 can be continued until the high resistivity region 18 extends inward of the surface 17s by a predetermined depth $d_O$. Process factors such as a time the portion 17e is exposed to the plasma P can be used to set the predetermined depth $d_O$. Preferably, the predetermined depth $d_O$ does not extend to a thickness $t_O$ of the electrode 17, especially if the plasma process P or the compounds such as oxygen ($O_2$), nitrogen ($N_2$), or carbon (C) that are used in the plasma process P will damage the data layer 11 or the other layers of material in the stack 20. Alternatively, the plasma process P that forms the high resistivity region 18 can be continued until the second resistivity $\rho_H$ of the high resistivity region 18 reaches a predetermined value of resistivity.

Figure 9D:
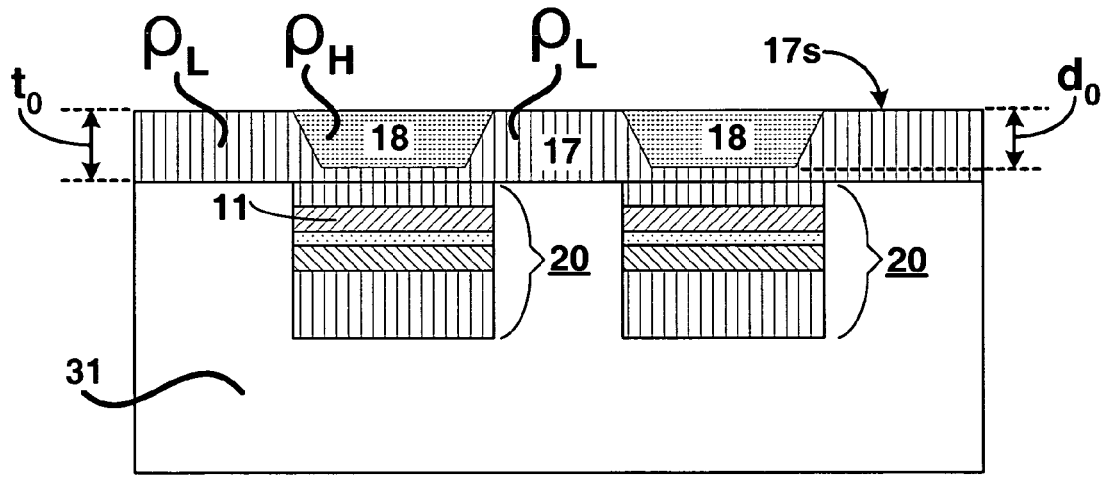

In FIG. 9d, at a stage 70, the plasma mask 27 is removed from the surface 17s of the electrode 17. For example, a solvent or a plasma ashing process can be used to remove the plasma mask 27. The high resistivity region 18 is completely formed in the electrode 17 and is positioned substantially over the data layer 11 so that the joule heat $J_H$ will be thermally conducted into the data layer 11 during a write operation as was described above. Although the actual value of the resistivity of the first resistivity $\rho_L$ of the electrode 17 and the second resistivity $\rho_H$ of the high resistivity region 18 will be application dependent, a typical resistivity of the electrode 17 will be in the micro-ohm-cm ($\mu\Omega$-cm) range. In contrast, in order to generate a significant amount of the joule heat $J_H$, a resistivity that is an order of magnitude (i.e 10x) or higher than the first resistivity $\rho_L$ of the electrode 17 is preferable for the second resistivity $\rho_H$ of the high resistivity region 18.

Plasma processes that are well understood in the microelectronics art can be used to compositionally modulate (i.e. increase the resistivity) the material of the electrode 17 to form the high resistivity region 18. For example, a plasma oxidation process that generates a gas plasma in a carrier gas that includes oxygen ($O_2$) can be used to form the high resistivity region 18. As another example, a plasma nitridation process that generates a gas plasma in a carrier gas that includes nitrogen ($N_2$) can be used to form the high resistivity region 18. As yet another example, a plasma carburization process that generates a gas plasma in a carrier gas that includes carbon (C) can be used to form the high resistivity region 18. Compounds other that the oxygen ($O_2$), the nitrogen ($N_2$), and the carbon (C) can be included in the carrier gas for the respective plasma processes. As an example, for plasma nitridation, the carrier gas can be the nitrogen ($N_2$) itself or the carrier gas can be argon (Ar) mixed with an ammonia ($NH_3$). As another example, for plasma carburization, the carrier gas can be argon (Ar) mixed with a carbon containing gas, and for plasma oxidation, the carrier gas can also be argon (Ar) mixed with oxygen ($O_2$).

Figure 8:
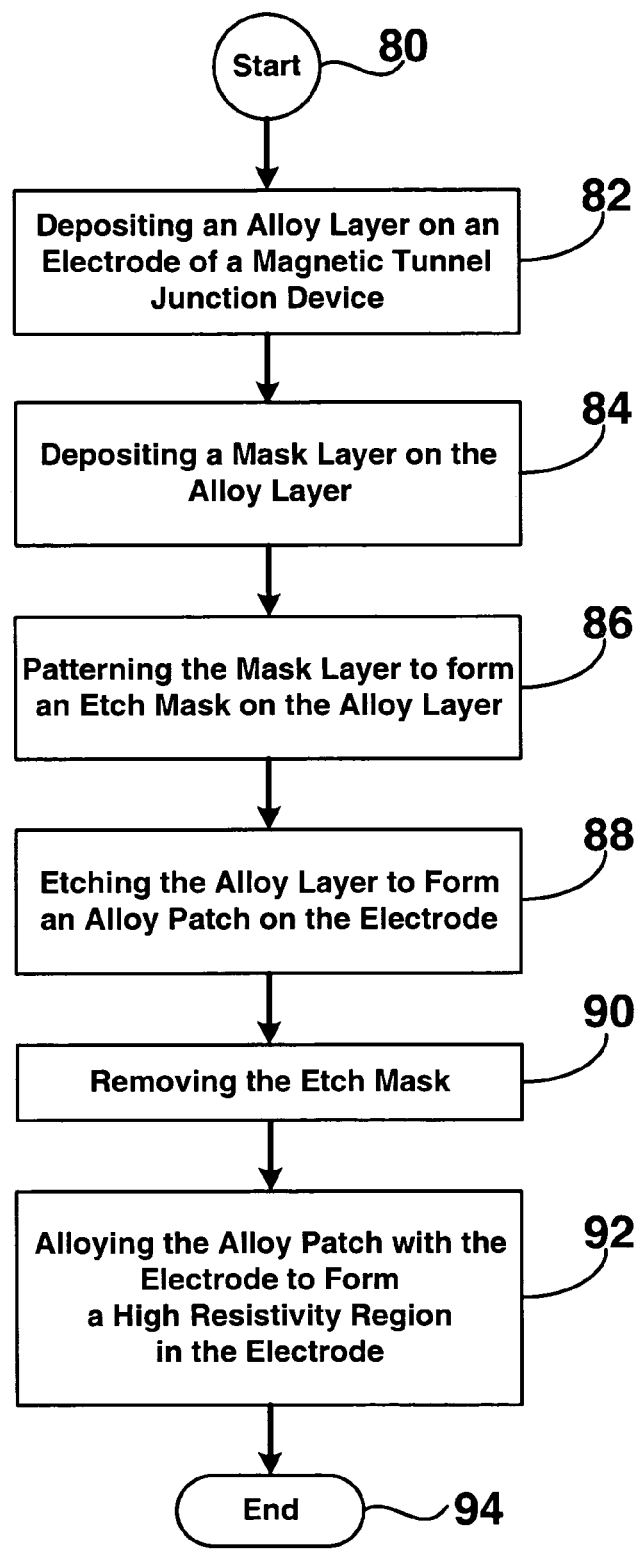
FIG. 8 is a flow diagram depicting an alternative method of fabricating a magnetic tunnel junction device with a compositionally modulated electrode.
Figure 10A:
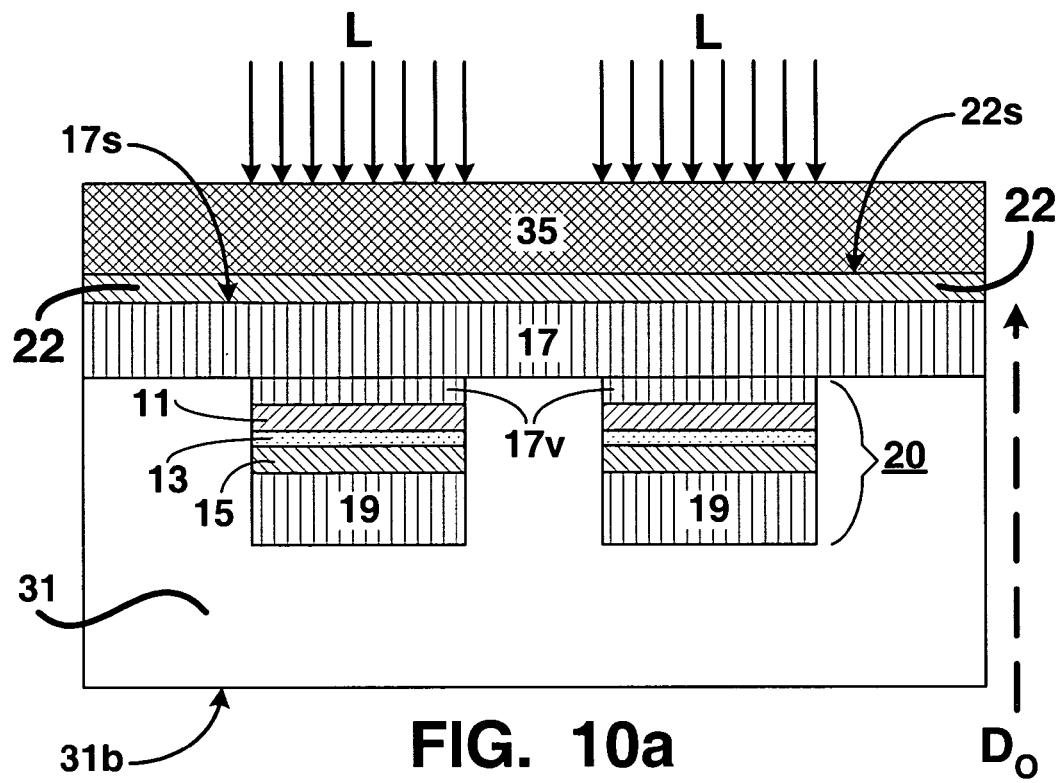
FIGS. 10a through 10f are cross-sectional views depicting fabrication of a magnetic tunnel junction device with a compositionally modulated electrode according to the method of FIG. 8.

In FIG. 10a and referring to a method of fabricating a compositionally modulated electrode in a magnetic tunnel junction device depicted in FIG. 8, at a stage 82, an alloy layer 22 is deposited on a surface 17s of a previously fabricated electrode 17 of a magnetic tunnel junction device 10. The electrode 17 includes the first resistivity $\rho_L$. As was described above, the various thin film layers of material that comprise the magnetic tunnel junction device 10 (i.e. 11, 13, 15, 17, 17v, 19, 21 and 31) have been previously fabricated in a process order $D_O$ and those layers are collectively denoted as the stack 20. Deposition processes including but not limited to sputtering, atomic layer deposition (ALD), chemical vapor deposition (CVD), and plasma enhanced chemical vapor deposition (PECVD) can be used to form the alloy layer 22. The alloy layer 22 can be made from an electrically conductive material and the electrically conductive material can include but is not limited to a metal, a metal alloy, and a semiconductor material.

Figure 10B:
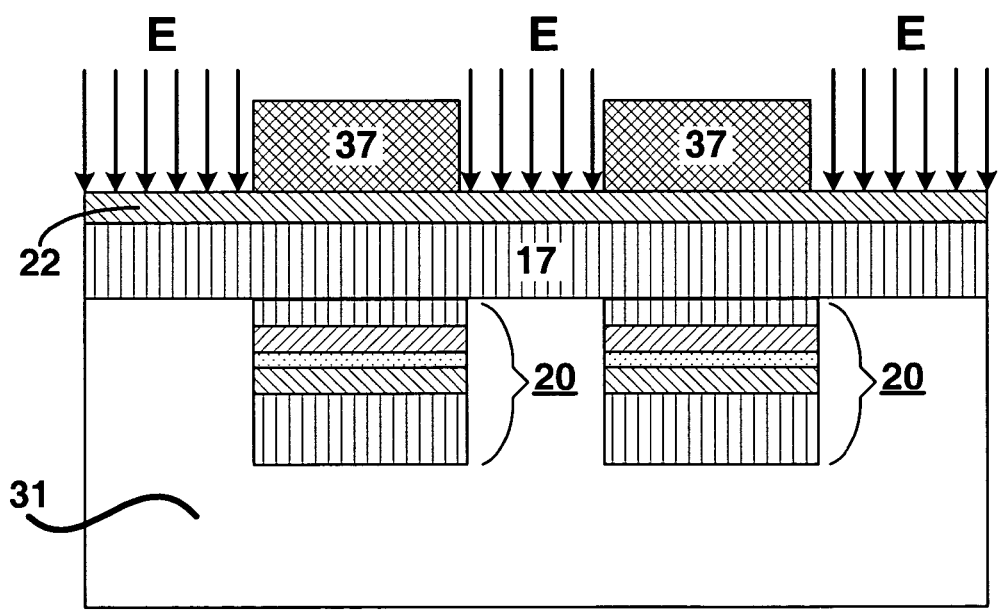

In FIG. 10a, at a stage 84, a mask layer 35 is deposited on the alloy layer 22. As was described above, the mask layer 35 can be a photoresist material that is deposited on a surface 22s of the alloy layer 22. At a stage 86, the mask layer 35 is patterned to form an etch mask (not shown) on the alloy layer 22. In FIGS. 10a and 10b, the patterning can include exposing the photoresist material of the mask layer 35 with a light L through a photo mask (not shown), and then developing or etching the photoresist material to form an etch mask 37 on the alloy layer 22. The etch mask 37 protects those portions of the alloy layer 22 that are covered by the etch mask 37 from being removed during a subsequent etch process.

Figure 10C:
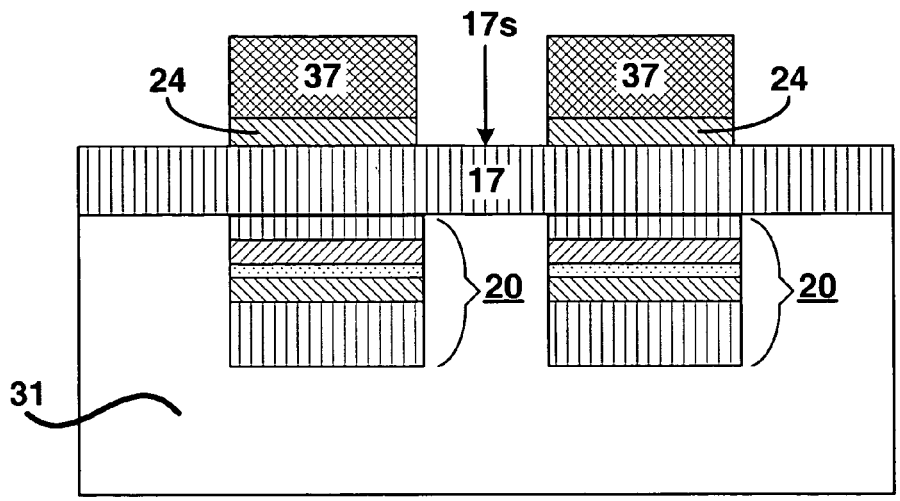

In FIGS. 10b and 10c, at a stage 88, the alloy layer 22 is etched E to form an alloy patch 24 on the surface 17s of the electrode 17. Preferably, an anisotropic/directional etching process such as a reactive ion etch (RIE) is used for the etching at the stage 88. At a stage 90, the etch mask 37 is removed from the alloy patch 24. For example, a solvent or a plasma ashing process can be used to remove the etch mask 37.

Figure 10D:
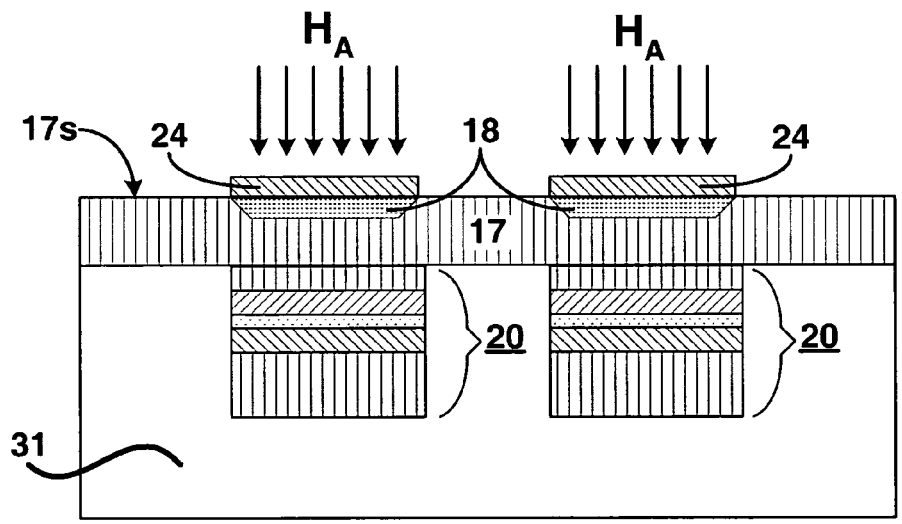

In FIG. 10d, at a stage 92, an alloying of the alloy patch 24 with the electrode 17 results in a forming of a high resistivity region 18 in the electrode 17. The alloying results from a heat $H_A$ being applied to the alloy patch 24 and the electrode 17 and the alloying creates a high resistivity region 18 that extends inward of the surface 17s. The high resistivity region 18 includes the second resistivity $\rho_H$ that is higher than the first resistivity $\Sigma_L$.

The actual alloying temperatures and times will be application and material dependent; however, the temperature used should not exceed a value that would cause a degradation of the magnetic materials used in the stack 20 of the magnetic tunnel junction 10. As an example only, typically the temperature used for the alloying at the stage 92 should not exceed a range from about 450° C. to about 500° C.

Figure 10E:
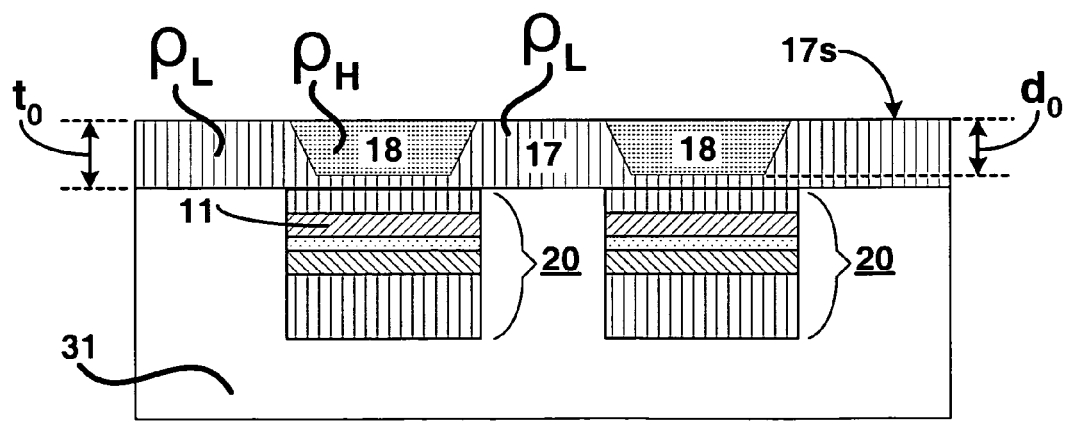

In FIG. 10e, the alloying of the alloy patch 24 with the electrode 17 can continue until the high resistivity region 18 extends inward of the surface 17s by the predetermined depth $d_O$ as was described above. Alternatively, the alloying process that forms the high resistivity region 18 can be continued until the second resistivity $\rho_H$ of the high resistivity region 18 reaches a predetermined value of resistivity.

Figure 9E:
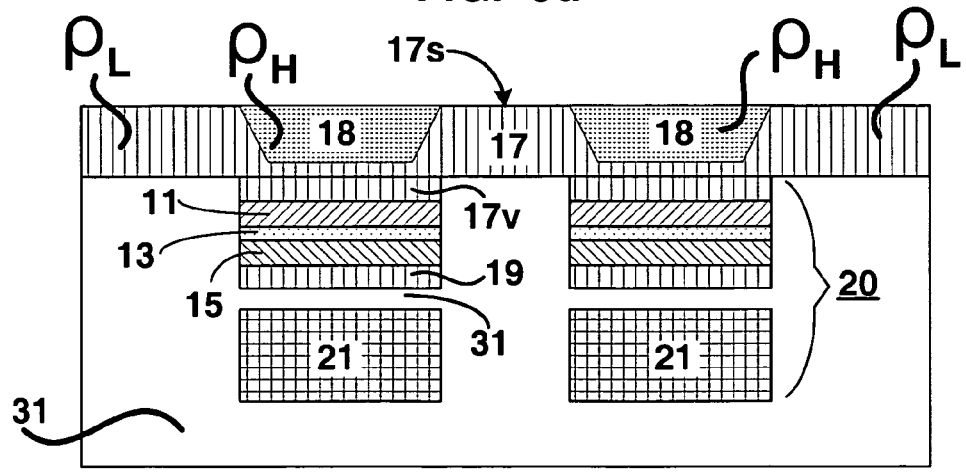
Figure 10F:
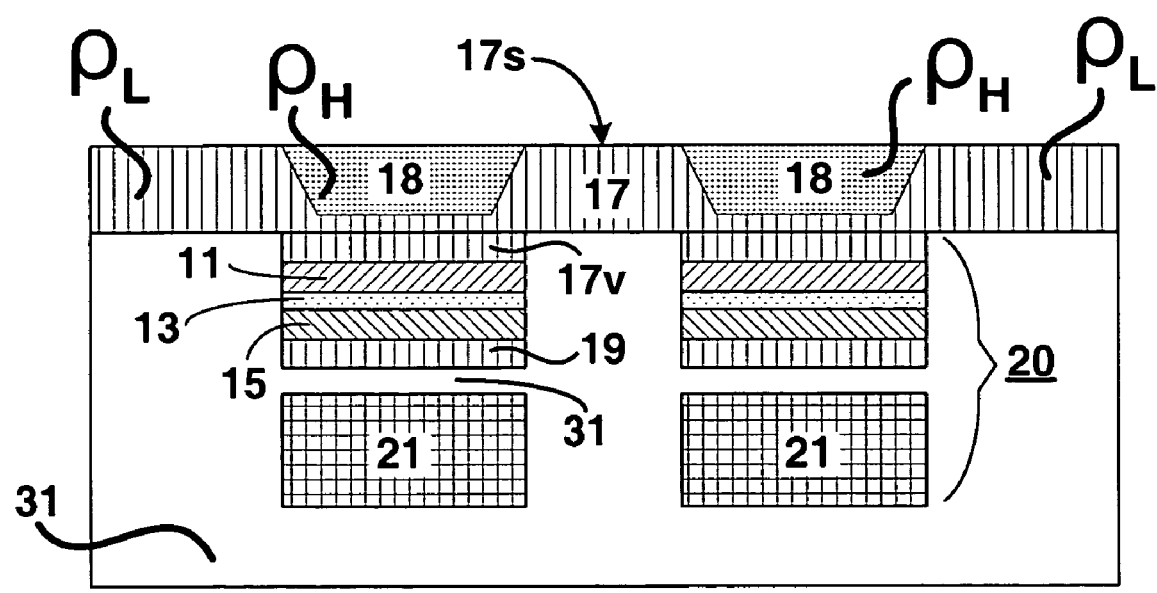

In FIGS. 9e and 10f, as was described above, the stack 20 can include a second electrode 21 that can serve as one of the write lines during a write operation to the data layer 11. For instance, the electrode 17 and the second electrode 21 can be write conductors for writing data to the data layer 11 during a write operation and the electrode 17 and the first electrode 19 can be column and row conductors used for sensing the state of the data layer 11 during a read operation.

Suitable materials for the electrode 17, the first electrode 19, the second electrode 21, the via 17v, the alloy layer 22, and the alloy patch 24 include but are not limited to aluminum (Al), tungsten (W), and copper (Cu). A resistivity of those materials can be increased (i.e. to form the second resistivity $\rho_H$ for the high resistivity region 18) by doping with materials including but not limited to nitrogen ($N_2$), oxygen ($O_2$), and carbon (C).

As an example, the electrode 17 can be made from doped polysilicon ($\alpha$-Si) or a silicide (i.e. a metal and silicon compound). A resistivity of the polysilicon can be increased (i.e. to form the second resistivity $\rho_H$ for the high resistivity region 18) by increasing a doping concentration of the electrode 17 at the high resistivity region 18. A resistivity of the suicide can be increased by varying a composition of the silicide by adjusting a metal to silicon (Si) ratio of the silicide.

As another example, the alloy layer 22 and the alloy patch 24 can be made from a doped glass including but not limited to a doped tetraethylorthosilicate (TEOS) such as a boron (B) doped tetraethylorthosilicate (BSG), a phosphorus (P) doped tetraethylorthosilicate (PSG), and a boron (B) and phosphorus (P) doped tetraethylorthosilicate (BPSG). Accordingly, if the alloy patch 24 is a doped glass, then the electrode 17 can be made from polysilicon ($\alpha$-Si), for example. On the other hand, if the alloy patch 24 is made from polysilicon (α-Si), then the electrode 17 can be made from a silicide, for example.

Although several embodiments of the present invention have been disclosed and illustrated, the invention is not limited to the specific forms or arrangements of parts so described and illustrated. The invention is only limited by the claims.

What is claimed is:

1. A method of fabricating a compositionally modulated electrode in a magnetic tunnel junction device, comprising:
    depositing a mask layer on a surface of a previously fabricated homogeneous electrode of the magnetic tunnel junction device, the electrode including a first resistivity and overhanging the magnetic tunnel junction device;
    patterning a plasma mask in the mask layer;
    forming the plasma mask in the mask layer so that a portion of the surface is exposed by the plasma mask;
    forming a high resistivity region that extends inward of the surface by exposing the portion of the surface to a plasma process selected from the group consisting of a plasma oxidation process, a plasma nitridation process, and a plasma carburization process, the high resistivity region including a second resistivity that is higher than the first resistivity; and
    removing the plasma mask from the surface of the electrode to expose a homogeneous electrode having a region of high resistivity adjacent to at least one region of first resistivity.

2. The method as set forth in claim 1 and further comprising:
    continuing the forming of the high resistivity region until the high resistivity region extends inward of the surface by a predetermined depth.

3. The method as set forth in claim 1, wherein the plasma oxidation process comprises a gas plasma including a carrier gas comprising oxygen.

4. The method as set forth in claim 1, wherein the plasma nitridation process comprises a gas plasma including a carrier gas comprising nitrogen.

5. The method as set forth in claim 1, wherein the plasma carburization process comprises a gas plasma including a carrier gas comprising carbon.

6. The method as set forth in claim 1, wherein the forming the plasma mask comprises a process selected from the group consisting of etching the mask layer and developing the mask layer.

7. The method as set forth in claim 1, wherein the mask layer comprises a photoresist material.

8. The method as set forth in claim 1 and further comprising:
    continuing the forming of the high resistivity region until the second resistivity of the high resistivity region reaches a predetermined value of resistivity.

9. The method as set forth in claim 1, wherein the method conditions at least one portions of the electrode to provide the region of high resistivity, the electrode remaining a unitary conductor.

10. The method as set forth in claim 1, wherein the region of high resistivity is aligned to the magnetic tunnel junction device, the at lest one region of first resistivity offset from the magnetic tunnel junction device.

11. The method as set forth in claim 1, wherein the homogeneous electrode is composed of a single metal or an alloy.

12. A method of fabricating a compositionally modulated electrode spanning a plurality of magnetic tunnel junction devices, comprising:
    depositing a mask layer on a surface of a previously fabricated electrode spanning a plurality of spaced apart magnetic tunnel junction stacks, the electrode including a first resistivity;
    patterning a plasma mask in the mask layer;
    forming the plasma mask in the mask layer so that a plurality of portions of the surface are exposed by the plasma mask, each exposed portion aligned to a tunnel junction stack;
    forming a high resistivity region that extends inward of the surface by exposing the portions of the surface to a plasma process selected from the group consisting of a plasma oxidation process, a plasma nitridation process, and a plasma carburization process, the high resistivity regions including a second resistivity that is higher than the first resistivity; and
    removing the plasma mask from the surface of the electrode to expose a homogeneous electrode having disposed therein a plurality of regions of high resistivity interspersed between regions of first resistivity.

13. The method as set forth in claim 12, wherein the regions of high resistivity are aligned to the magnetic tunnel junction stacks, the regions of first resistivity aligned between the magnetic tunnel junction stacks.

14. The method as set forth in claim 12, wherein the electrode is a homogeneous electrode having disposed therein regions of high resistivity interspaced with regions of first resistivity.

15. The method as set forth in claim 12, wherein the method conditions existing portions of the electrode to provide regions of high resistivity, the electrode remaining a unitary conductor.

16. The method as set forth in claim 12, wherein the electrode is composed of a single metal or an alloy.

17. The method as set forth in claim 12 and further comprising:
    continuing the forming of the high resistivity region until the high resistivity region extends inward of the surface by a predetermined depth.

18. The method as set forth in claim 12, wherein the mask layer comprises a photoresist material.

19. The method as set forth in claim 12 and further comprising:
    continuing the forming of the high resistivity region until the second resistivity of the high resistivity region reaches a predetermined value of resistivity.

* * * * *